US012812802B2

(12) United States Patent
Schmidt et al.

(10) Patent No.: US 12,812,802 B2
(45) Date of Patent: Nov. 24, 2026

(54) HIGH-VOLTAGE COMPONENT

(71) Applicant: GKN Automotive Ltd., Birmingham (GB)

(72) Inventors: Mark Schmidt, Königswinter (DE); Frank Bernreuther, St. Augustin (DE); Torsten Tietgen, Overath (DE); Aitor Tejado, Anoain (ES); Nico Maurin, Bornheim (DE)

(73) Assignee: GKN Automotive Limited, Birmingham (GB)

(*) Notice: Subject to any disclaimer, the term of this patent is extended or adjusted under 35 U.S.C. 154(b) by 274 days.

(21) Appl. No.: 18/708,685

(22) PCT Filed: Apr. 27, 2022

(86) PCT No.: PCT/EP2022/061204
§ 371 (c)(1),
(2) Date: May 9, 2024

(87) PCT Pub. No.: WO2023/208335
PCT Pub. Date: Nov. 2, 2023

(65) Prior Publication Data

US 2025/0016944 A1 Jan. 9, 2025

(51) Int. Cl.
*H05K 5/02* (2006.01)
*B60L 15/00* (2006.01)
(Continued)

(52) U.S. Cl.
CPC .......... *H05K 5/0247* (2013.01); *B60L 15/007* (2013.01); *H02K 5/225* (2013.01); *H05K 5/03* (2013.01)

(58) Field of Classification Search
CPC ...... H05K 5/0247; H05K 5/03; H05K 7/1432; B60L 15/007; B60L 3/0061; H02K 5/225
See application file for complete search history.

(56) References Cited

U.S. PATENT DOCUMENTS 9,085,240 B2 * 7/2015 Rathmacher .......... B60L 3/0007
9,252,523 B2 2/2016 Tokunaga et al.
(Continued)

FOREIGN PATENT DOCUMENTS

CN 210780313 U 6/2020
DE 102014108503 A1 12/2014
(Continued)

OTHER PUBLICATIONS

JP Office Action for JP Application No. 2024-556784 dated Nov. 4, 2025 (10 pages).
(Continued)

*Primary Examiner* — Jacob R Crum
(74) *Attorney, Agent, or Firm* — Reising Ethington P.C.

(57) ABSTRACT

A high-voltage component includes a housing and a high-voltage connection arranged therein. The housing includes a cover element, which closes an opening of the housing. The high-voltage connection is accessible from the outside exclusively via the opening. The cover element is releasably connected to the housing via a plurality of connecting elements. A cable extends, from a non-detachable first connection arranged on the housing, outside the housing at least partially over the cover element to a second connection arranged on the housing in such a way that at least one first connecting element is covered by the cable and is thus not accessible from the outside.

13 Claims, 4 Drawing Sheets

(51) Int. Cl.
*H02K 5/22* (2006.01)
*H05K 5/03* (2006.01)

(56) References Cited

U.S. PATENT DOCUMENTS 9,812,919 B2 11/2017 Arashi
2005/0032404 A1* 2/2005 Furuta .................. H01R 13/641 439/157
2013/0241282 A1* 9/2013 Ikeno ...................... B60R 16/03 307/9.1
2014/0014407 A1* 1/2014 Krieg ...................... F16G 11/06 24/135 R
2014/0349516 A1* 11/2014 Tokunaga ............ H02K 11/225 439/527
2014/0375116 A1 12/2014 Deneszczuk et al.
2018/0257510 A1* 9/2018 Sumikawa ............ B60L 15/007
2020/0039658 A1* 2/2020 Klein ........................ B60F 5/02

FOREIGN PATENT DOCUMENTS

JP 2013082273 A 5/2013
JP 2013090366 A 5/2013
JP 2013198305 A 9/2013
JP 2014034960 A 2/2014
JP 2017060225 A 3/2017
JP 2018082537 A 5/2018

OTHER PUBLICATIONS

International Search Report and Written Opinion for PCT/EP2022/061204 mailed Dec. 13, 2022 (11 pages; with English translation).

* cited by examiner

HIGH-VOLTAGE COMPONENT

CROSS-REFERENCE TO RELATED APPLICATIONS

This application is a national stage of, and claims priority to, Patent Cooperation Treaty Application No. PCT/EP2022/061204, filed on Apr. 27, 2022, which application is hereby incorporated herein by reference in its entirety.

BACKGROUND

High voltage is defined as a voltage of more than 60 volts (DC) or 30 volts (AC), particularly in the automotive sector. Low voltage therefore comprises a voltage of at most 60 volts (DC) or 30 volts (AC).

Such high-voltage components must be protected in a special way due to the higher risk of electric shocks to people. In particular, protective measures must be taken to protect workshop personnel from electric shocks.

Detaching a cover that is used to close an opening on the housing of the high-voltage component, e.g. to disconnect or enable a connection between a high-voltage bus line of an inverter and high-voltage terminals of a stator of an electric motor, carries the risk of a high-voltage electric shock during maintenance/servicing.

Technical solutions are required, e.g. to discharge the high voltage in an inverter before the cover is opened and thus prevent electric shock. Conventional solutions, e.g. additional contact switches on the cover that can detect when the cover is opened, involve risks of malfunction and are expensive.

There is a constant need to improve safety when handling electrical components, especially high-voltage components.

SUMMARY

The disclosure relates to a high-voltage component, at least comprising a housing and a high-voltage terminal arranged therein. The high-voltage component is used in particular in the automotive sector and is, for example, an electric motor, e.g. a traction drive.

The present disclosure provides a high-voltage component, which can be maintained or serviced without the risk of a high-voltage electric shock.

The features listed individually in the claims can be combined with each other in a technologically meaningful way and can be supplemented by explanatory facts from the description and/or details from the figures, whereby further embodiments of the invention are shown.

A high-voltage component is proposed, at least comprising a housing and a high-voltage terminal arranged therein. The housing comprises a cover element which closes an opening of the housing, the high-voltage terminal being accessible exclusively via the opening from the outside (i.e. from outside the housing for a person). The cover element is detachably connected to the housing via a plurality of (first and second) connecting elements. A cable extends outside the housing and, starting from a non-detachable first connection arranged on the housing, at least partially over the cover element to a second connection arranged on the housing in such a way that at least one first connecting element is covered by the cable and is therefore not accessible from the outside. The cable is electrically conductively connected to the high-voltage component at the second connection. Disconnecting the second connection causes the high-voltage component to discharge.

A voltage of more than 60 volts is applied to the high-voltage connection.

In particular, the cover element is connected to the housing via a number of connecting elements (e.g. screws, clips, pins, etc.). Each of these connecting elements can be detached from the outside. In particular, the cover element can only be removed from the housing after all connecting elements have been detached. The at least one first connecting element (or all first connecting elements) is covered by the cable and is therefore not accessible from the outside, i.e. the first connecting element can only be detached when the cable is moved away from this position. In particular, the cover element can only be moved after the at least one first connecting element (or after all first connecting elements) have been detached, so that the opening is at least partially exposed.

In particular, connecting elements, which—when the cable is connected to the high-voltage component at the second connection—are covered by the cable and are therefore not accessible from the outside, are identified as first connecting elements.

In particular, connecting elements, which—when the cable is connected to the high-voltage component at the second connection—are not covered by the cable and are therefore accessible from the outside at all times or independently of the cable, are identified as second connecting elements. In addition to the at least one first connecting element, the cover element can also be connected to the housing by at least one second connecting element. Each second connecting element could therefore be detached at any time or independently of the cable, whereby if the at least one first connecting element is not yet detached, the cover element continues to cover the opening and thus prevents access from the outside to the high-voltage terminal.

In particular, the cable extends outside the housing and, starting from a non-detachable first connection arranged on the housing, at least partially via the cover element to a second connection arranged on the housing. The cable is electrically connected to the high-voltage component at the second connection, e.g. via a plug-in connection. After detaching the second connection (and possibly other fastenings/connections), the cable can be moved in particular, e.g. around a pivot point realized by the first connection, so that the at least one first connecting element is accessible from the outside. Because detaching the second connection causes the high-voltage component to discharge, the cover element can be opened safely after the second connection has been detached.

In particular, the cable itself or a cable guide connected to the cable has such a high resistance to deformation or a precisely matched length between the first connection and the second connection, so that when the cable is connected to the high-voltage component at the second connection, deformation of the cable is at least not possible to such an extent that the at least one first connecting element would be accessible from the outside.

The detaching of the second connection causes, in particular, a disconnection of an electric circuit in a pin header of the plug connection provided there, whereby, for example, the high-voltage terminal accessible via the opening (e.g. of an inverter) is discharged.

In particular, only after the at least one first connecting element has been detached the cover element can be moved so that the high-voltage terminal is accessible from outside the housing via the opening.

In particular, at least two first connecting elements are covered by the cable. This ensures that the cover element cannot be rotated around the one first connecting element, for example, after all second connecting elements have been detached.

In particular, the cable is detachably connected to the housing between the first connection and the second connection via at least one first fastening. The first fastening can be a screw, clip or pin connection, for example. In particular, the first fastening can be similar to the connecting elements, i.e. have a screw, a clip or a pin.

The first fastening serves in particular to further fix the cable to the housing, so that it is ensured that the at least one first connecting element is not accessible from the outside.

In particular, the at least one first connecting element is only accessible from the outside after the second connection and the at least one first fastening have been detached.

In particular, the cable is arranged at least partially in a cable guide, which has a defined bending stiffness or a defined deformation resistance, wherein the cable is fastened at least to the at least one first fastening via the cable guide. The cable guide stiffens the cable in particular, so that it is ensured that the cable cannot be deformed in such a way that the at least one first connecting element would be accessible from the outside if the second connection is not detached.

In particular, the second connection is a plug connection. In particular, the cable has a plug at this end, which can be connected to a plug receptacle on the housing to form the plug connection. In particular, a (safety) circuit is closed with the plug connection, whereby a disconnection of the second connection or the plug connection in particular causes a disconnection of the circuit, e.g. in a pin header of the plug connection, whereby, for example, the high-voltage connection accessible via the opening (e.g. of an inverter) is discharged.

In particular, the cable is a low-voltage connection and the second connection is a low-voltage terminal. Detaching the second connection therefore does not pose the risk of an electric shock.

A voltage of at most 60 volts (DC) or 30 volts (AC) is applied to the low-voltage terminal.

In particular, at least the at least one (or each) first connecting element, possibly the (or each) second connecting element, comprises at least one screw.

In particular, the high-voltage component is a traction drive and the high-voltage terminal comprises an electrically conductive connection between an inverter and a stator of the traction drive. However, the high-voltage component described can also comprise other electrical components that have at least one covered high-voltage terminal and one low-voltage terminal (at the second connection).

In particular, the high-voltage component comprises an inverter carrying the high voltage and the traction drive connected to it. If the inverter is discharged, high voltage is no longer present at the high-voltage terminal.

The use of indefinite articles ("an", "a"), in particular in the claims and the description reproducing them, is to be understood as such and not as a number word. Accordingly, terms or components introduced thereby are to be understood as being present at least once and, in particular, as being present more than once.

As a precaution, it should be noted that the number words used here ("first", "second", . . . ) are primarily (only) used to distinguish between several similar objects, quantities or processes, i.e. in particular they do not necessarily specify any dependency and/or sequence of these objects, quantities or processes in relation to one another. If a dependency and/or sequence is required, this is explicitly stated here or is obvious to the person skilled in the art when studying the specific embodiment described. Insofar as a component may occur more than once ("at least one"), the description of one of these components may apply equally to all or some of the plurality of these components, but this is not mandatory.

BRIEF DESCRIPTION OF THE DRAWINGS

The disclosure and the technical context are explained in more detail below with reference to the accompanying figures. It should be noted that the disclosure is not intended to be limited by the design variants given. In particular, unless explicitly shown otherwise, it is also possible to extract partial aspects of the facts explained in the figures and to combine them with other components and findings from the present description. In particular, it should be noted that the figures and especially the proportions shown are only schematic. The figures show

DETAILED DESCRIPTION

Figure 1:
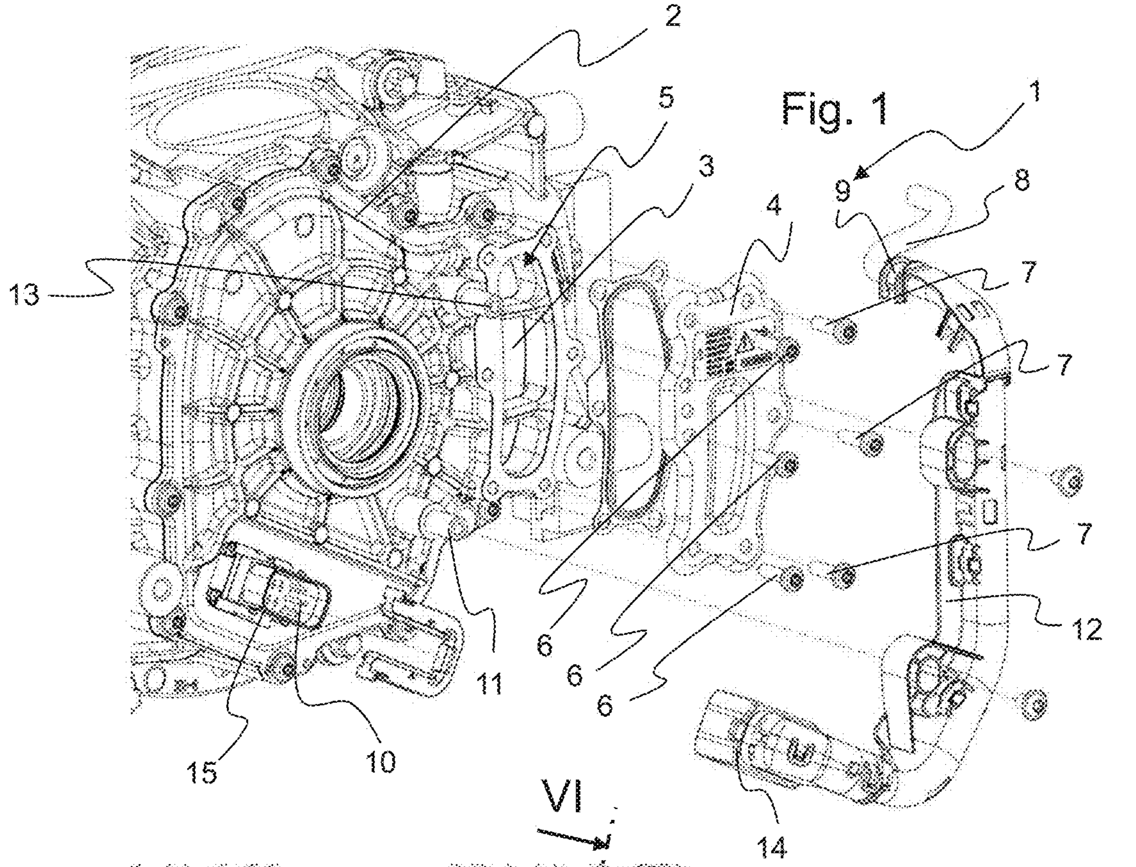
FIG. 1: a high-voltage component in an exploded view, in a perspective view.
Figure 2:
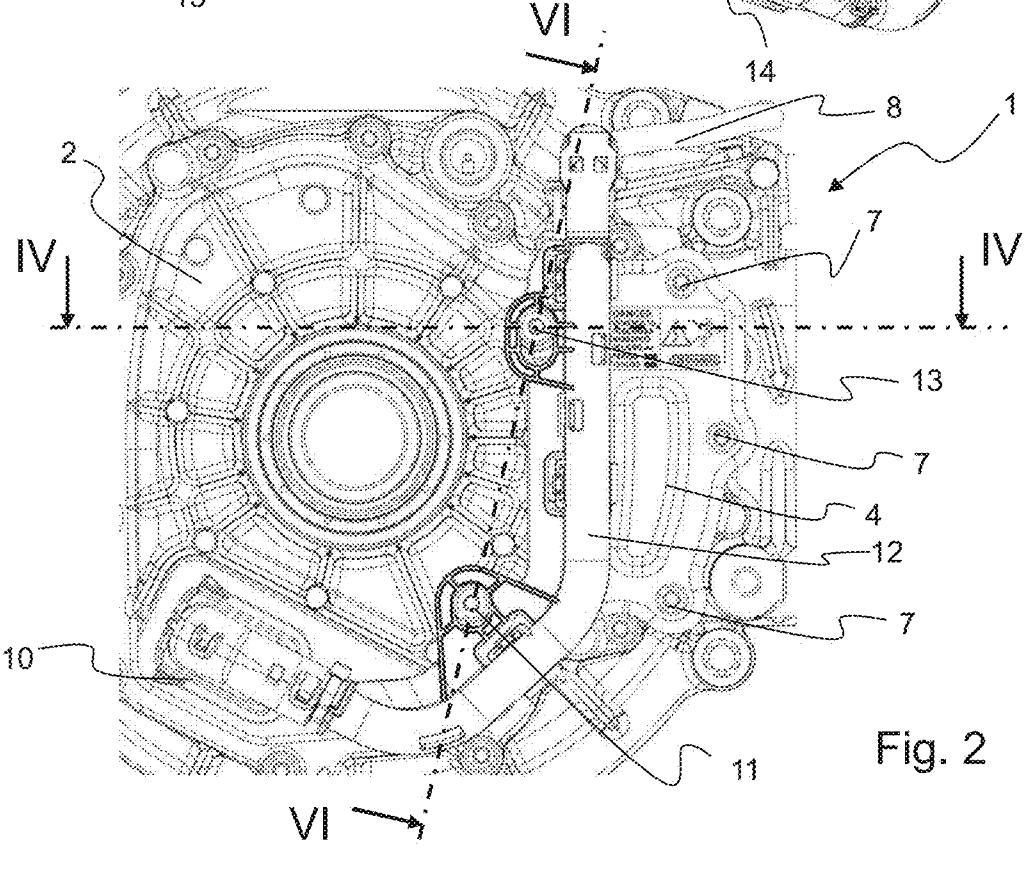
FIG. 2: a top view of the high-voltage component shown in FIG. 1.
Figure 3:
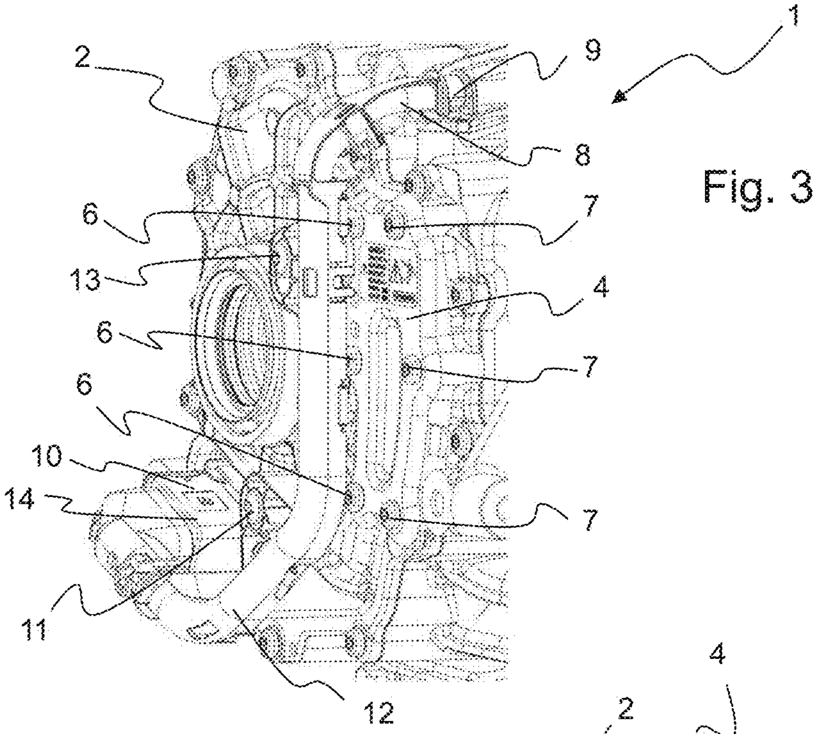
FIG. 3: the high-voltage component according to FIG. 2 in a perspective side view.
Figure 4:
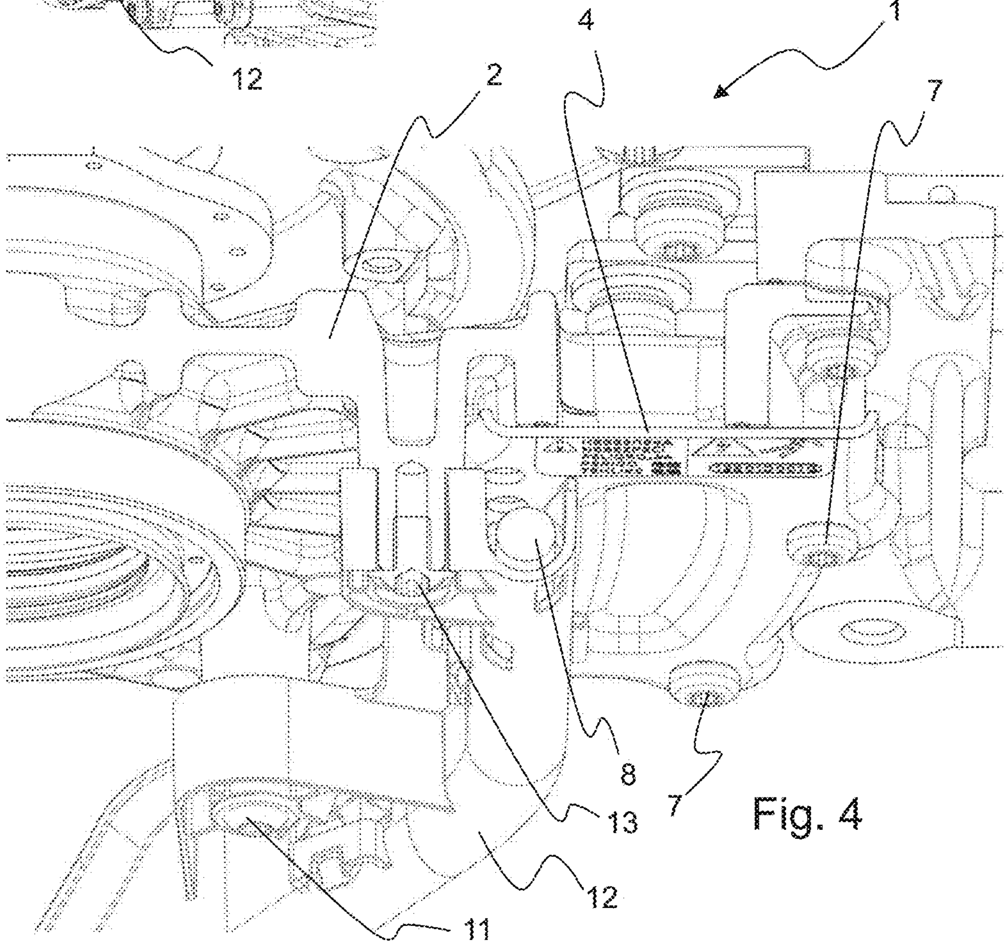
FIG. 4: the high-voltage component according to FIGS. 1 to 3, in a partial section along the section line IV-IV according to FIG. 2, in a perspective view from above.
Figure 5:
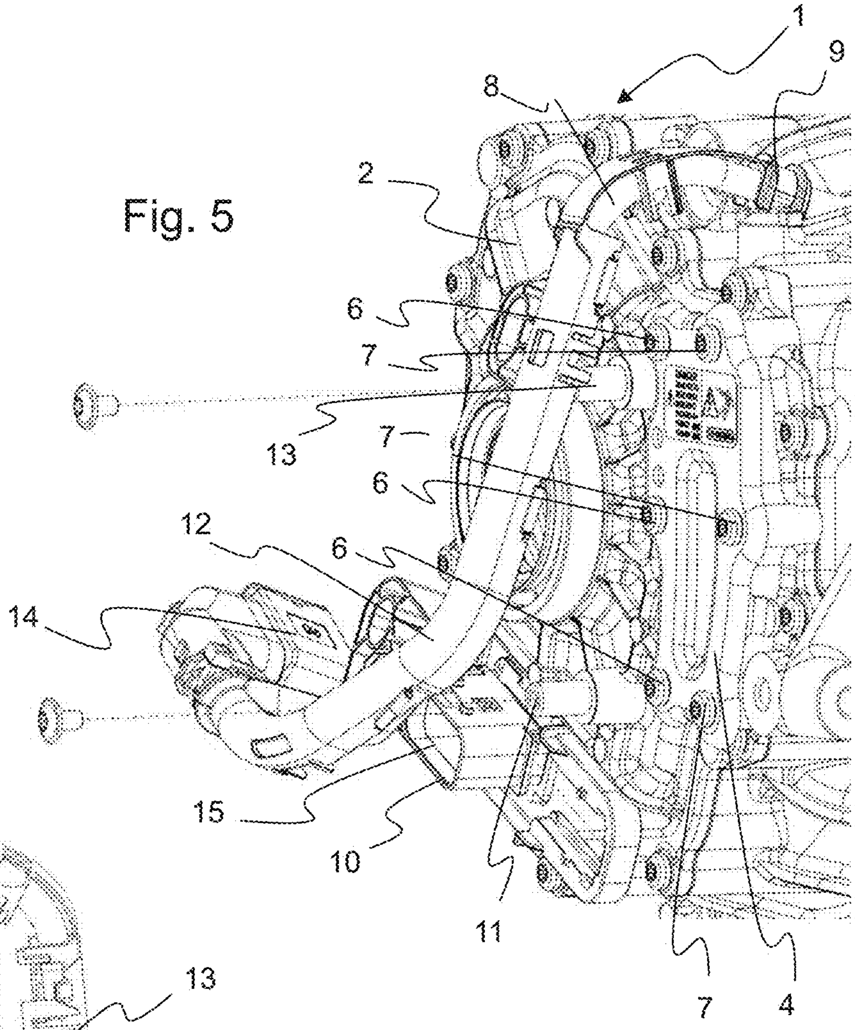
FIG. 5: a perspective side view of the high-voltage component according to FIGS. 1 to 4, after the second connection and a first and a second fastening have been detached.
Figure 6:
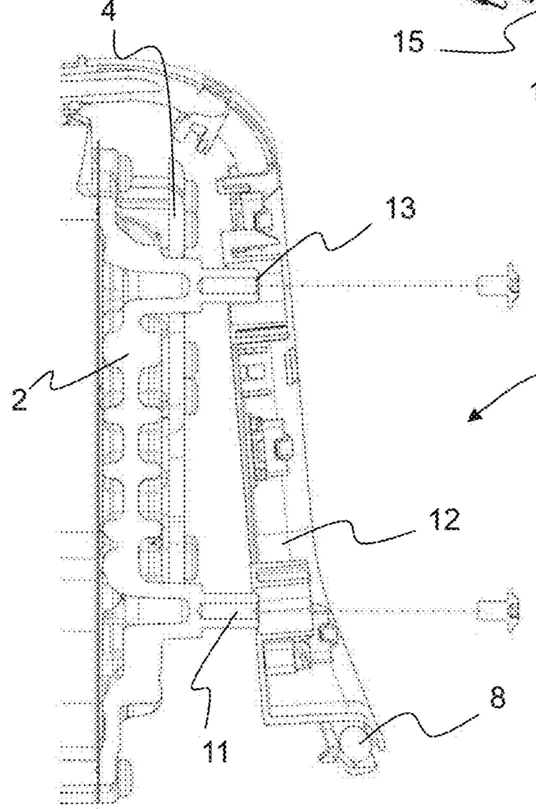
FIG. 6: a section of FIG. 5 in a side view along the section line VI-VI according to FIG. 2.
Figure 7:
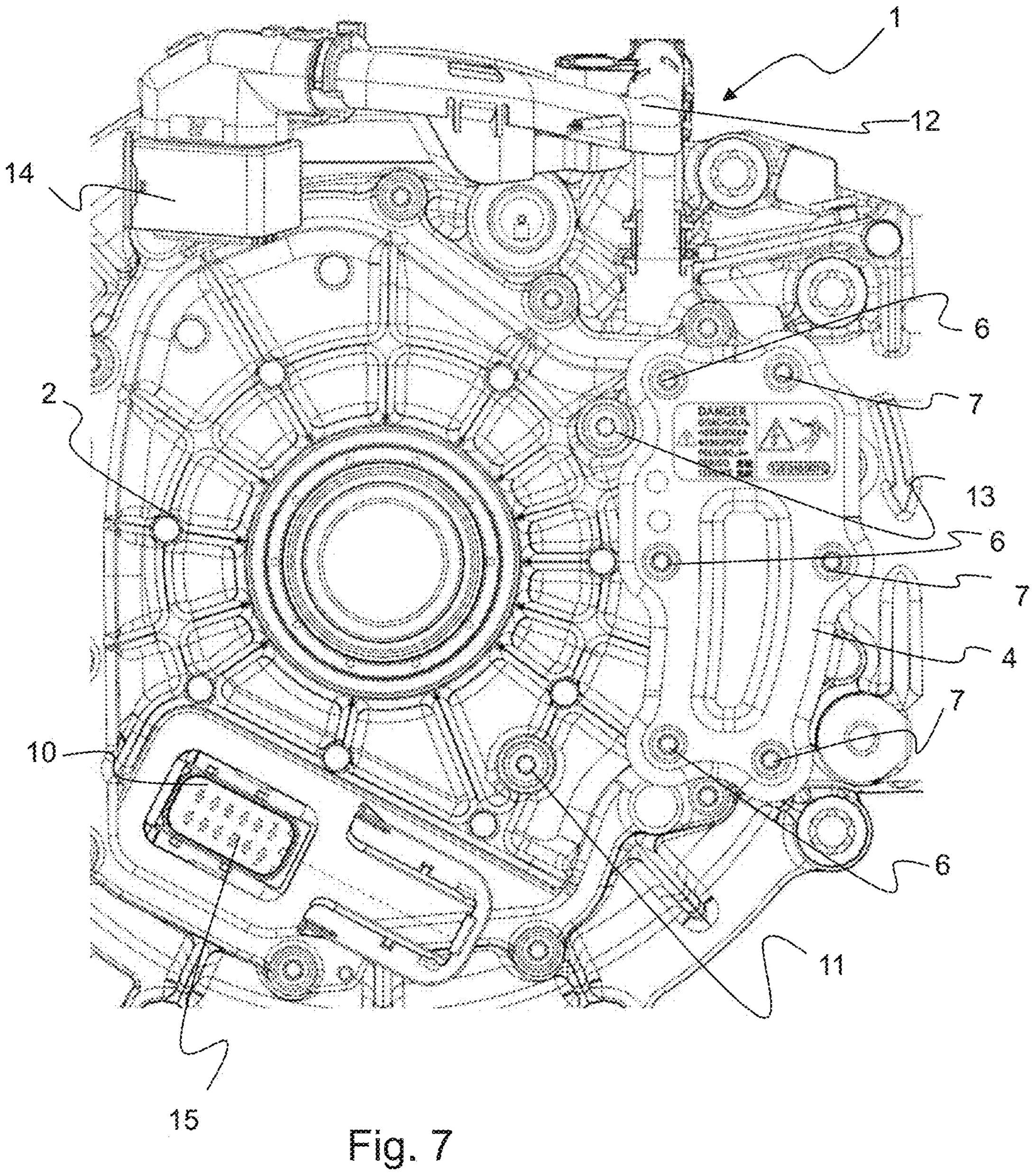
FIG. 7: the high-voltage component according to FIGS. 5 and 6 with swiveled cable and exposed cover element, in a top view.

FIG. 1 shows a high-voltage component 1 in an exploded view, in a perspective view. FIG. 2 shows a top view of the high-voltage component 1 shown in FIG. 1. FIG. 3 shows the high-voltage component 1 according to FIG. 2 in a perspective side view. FIG. 4 shows the high-voltage component 1 according to FIGS. 1 to 3, in a partial section along the section line IV-IV according to FIG. 2, in a perspective view from above. FIG. 5 shows the high-voltage component 1 according to FIGS. 1 to 4, after the second connection and a first and a second fastening have been detached, in a perspective side view. FIG. 6 shows a section of FIG. 5 in a side view in section along the section line VI-VI according to FIG. 2. FIG. 7 shows the high-voltage component 1 according to FIGS. 5 and 6 with swiveled cable 8 and exposed cover element 4, in a top view. FIGS. 1 to 7 are described together below.

The top view, side view and view from above can be seen in FIGS. 1 and 2. The top view is a view along the direction of explosion of the exploded view in FIG. 1. The side views are views from the right or left of the high-voltage component 1 according to FIG. 2. The top view is a view from above of the high-voltage component 1 according to FIG. 2.

The high-voltage component 1 comprises a housing 2 and a high-voltage terminal 3 arranged therein (not shown in detail). The housing 2 comprises a cover element 4, which closes an opening 5 of the housing 2, whereby the high-voltage terminal 3 is only accessible to a person from the outside (i.e. from outside the housing 2) via the opening 5. The cover element 4 is detachably connected to the housing 2 via a plurality of (first and second) connecting elements 6, 7. A cable 8 extends outside the housing 2 and, starting from a non-detachable first connection 9 arranged on the housing 2, extends at least partially over the cover element 4 to a second connection 10 arranged on the housing 2 in such a way that three first connecting elements 6 are covered by the cable 8 and are therefore not accessible from the outside. The cable 8 is electrically conductively connected to the high-voltage component 1 at the second connection 10. Disconnecting the second connection 10 causes the high-voltage component 1 to discharge.

The high-voltage component 1 is a traction drive for a motor vehicle and the high-voltage terminal 3 comprises an electrically conductive connection between an inverter and a stator (not shown in detail) of the traction drive. The inverter carries the high voltage. If the inverter is discharged, high voltage is no longer present at the high-voltage terminal 3.

The cover element 4 is connected to the housing 2 via six connecting elements 6, 7 designed as screws. Each of these connecting elements 6, 7 can be detached from the outside. The cover element 4 can only be removed from the housing 2 after all connecting elements 6, 7 have been detached. The first three connecting elements 6 are covered by the cable 8 and are therefore not accessible from the outside (see FIGS. 2 and 4), i.e. the first connecting elements 6 can only be detached when the cable 8 is moved away from this position (see FIGS. 5, 6 and 7). The cover element 4 can only be moved after the three first connecting elements 6 have been detached, so that the opening 5 is exposed.

The second connecting elements 7 are connecting elements 6, 7 which, when the cable 8 is connected to the high-voltage component 1 at the second connection 10, are not covered by the cable 8 (see FIGS. 2 to 4) and are therefore accessible from the outside at all times or independently of the cable 8. In addition to the three first connecting elements 6, the cover element 4 is also connected to the housing 2 by three second connecting elements 7. Each second connecting element 7 can therefore be detached at any time or independently of the cable 8, whereby, if the three first connecting elements 6 are not yet detached, the cover element 4 continues to cover the opening 5 and thus prevents access from the outside to the high-voltage terminal 3.

The cable 8 extends outside the housing 2 and, starting from the non-detachable first connection 9 arranged on the housing 2, extends at least partially via the cover element 4 to the second connection 10 arranged on the housing 2. The cable 8 is electrically conductively connected to the high-voltage component 1 at the second connection 10 via a plug connection (see FIGS. 1 to 3). After detaching the second connection 10 as well as a first fastening 11 and a second fastening 13, the cable 8 can be moved around a pivot point realized by the first connection 9 so that the three first connecting elements 6 are accessible from the outside. Because detaching the second connection 10 causes the high-voltage component 1 to discharge, the cover element 4 can be opened safely as soon as the second connection 10 is released.

The cable 8 itself and a cable guide 12 connected to the cable 8 have such a high deformation resistance or a precisely matched length between the first connection 9 and the second connection 10 that, when the cable 8 is connected to the high-voltage component 1 at the second connection 10, deformation of the cable 8 is at least not possible to such an extent that the first connecting elements 6 would be accessible from the outside.

Releasing the second connection 10 causes an electric circuit in a pin header of the plug connection provided there to be disconnected, as a result of which the high-voltage terminal 3 accessible via the opening 5 is discharged.

The cover element 4 can only be moved after the three first connecting elements 6 (and the second connecting elements 7) have been detached so that the high-voltage terminal 3 is accessible from outside the housing 2 via the opening 5.

The cable 8 is detachably connected to the housing 2 between the first connection 9 and the second connection 10 via the first fastening 11 and the second fastening 13. The first and second fastenings 11 and 13 are each designed as a screw connection.

The first fastening 11 and the second fastening 13 serve to further secure the cable 8 to the housing 2, so that it is ensured that the first connecting elements 6 are not accessible from the outside.

The first connecting elements 6 are only accessible from the outside after detaching the second connection 10 and the first fastening 11 as well as the second fastening 13.

The cable 8 is at least partially arranged in the cable guide 12, which has a defined bending stiffness or a defined deformation resistance, whereby the cable 8 is attached to the first fastening 11 and the second fastening 13 via the cable guide 12, or the cable guide 12 is attached to the housing 2 via the first fastening 11 and the second fastening 13. The cable guide 12 further stiffens the cable 8, so that it is ensured that the cable 8 cannot be deformed in such a way that the three first connecting elements 6 would be accessible from the outside if the second connection 10 is not released.

The second connection 10 is designed as a plug-in connection. At this end, the cable 8 has a plug 14, which can be connected to a plug receptacle 15 on the housing 2 to form the plug connection or the second connection 10. A (safety) circuit is closed with the plug connection, whereby disconnecting the second connection 10 or the plug connection causes the circuit to be disconnected, e.g. in a pin header of the plug connection, whereby the high-voltage terminal 3 accessible via the opening 5 is discharged.

The cable 8 is a low-voltage connection and the second connection 10 is a low-voltage terminal. Disconnecting the second connection 10 therefore does not entail the risk of an electric shock.

REFERENCE SYMBOL LIST

1 high-voltage component
2 housing
3 high-voltage terminal
4 cover element
5 opening
6 first connecting element
7 second connecting element
8 cable
9 first connection
10 second connection
11 first fastening
12 cable guide
13 second attachment
14 plug
15 plug receptacle

The invention claimed is:

1. A high-voltage component, comprising:

a housing including a cover element which closes an opening of the housing, the cover element being detachably connected to the housing via a plurality of connecting elements;

a high-voltage connection arranged in the housing and being accessible from the outside exclusively via the opening; and a cable, arranged outside the housing, extends from a non-detachable first connection arranged on the housing to a second connection that is selectively detachable and arranged on the housing, the cable, in a connected state of the second connection, (a) is arranged at least partially over the cover element such that at least one connecting element is covered by the cable and is thus not accessible from the outside, and (b) is electrically conductively connected to the high-voltage component at the second connection;

wherein, in a disconnected state of the second connection, the high-voltage component is configured to discharge, wherein the cable is detachably connected to the housing between the first connection and the second connection via at least one first fastening, the at least one connecting element is configured to be accessible from the outside only in the disconnected state of the second connection and after detachment of the at least one first fastening, and the cable is arranged at least partially in a cable guide, the cable being fastened via the cable guide at least to the at least one first fastening and the cable guide stiffens the cable so that the cable cannot be deformed such that the at least one first connecting element would be accessible from the outside if the second connection is not detached.

2. The high-voltage component according to claim 1, wherein the cover element is configured to be removable after release of the at least one connecting element.

3. The high-voltage component according to claim 1, wherein at least two connecting elements are covered by the cable.

4. The high-voltage component according to claim 1, wherein the second connection is a plug connection.

5. The high-voltage component according to claim 1, wherein the cable is a low-voltage connection and the second connection is a low-voltage connection.

6. The high-voltage component according to claim 1, wherein the at least one connecting element is a screw.

7. The high-voltage component according to claim 1, wherein the high-voltage component is a traction drive and the high-voltage connection comprises an electrically conductive connection between an inverter and a stator of the traction drive.

8. The high-voltage component according to claim 1, wherein, in the disconnected state of the second connection, the cable is configured to pivot about the non- detachable first connection such that the at least one connecting element is accessible from the outside.

9. The high-voltage component according to claim 1, wherein the at least one connecting element is configured to selectively secure the cover element to the housing.

10. The high-voltage component according to claim 1, further comprising at least one further connecting element, the at least one further connecting element configured to selectively secure the cover element to the housing, wherein, in the connected state of the second connection, the at least one further connecting element is accessible from the outside.

11. The high-voltage component according to claim 10, wherein the cover element is configured to be removable after release of the at least one connecting element and release of the at least one further connecting element.

12. The high-voltage component according to claim 1, the cable guide being detachably connected to the housing.

13. The high-voltage component according to claim 1, wherein the cable is attached to the first fastening and to a second fastening via the cable guide, or the cable guide is attached to the housing via the first fastening and the second fastening.

* * * * *